United States Patent
Mantese et al.

(10) Patent No.: US 10,907,270 B2
(45) Date of Patent: Feb. 2, 2021

(54) METHOD FOR MAGNETIC FLUX COMPENSATION IN A DIRECTIONAL SOLIDIFICATION FURNACE UTILIZING A STATIONARY SECONDARY COIL

(71) Applicant: Raytheon Technologies Corporation, Farmington, CT (US)

(72) Inventors: Joseph V. Mantese, Ellington, CT (US); Thomas Anthony Rebbecchi, West Hartford, CT (US); Ryan C. Breneman, Newington, CT (US); Andrew Boyne, West Hartford, CT (US); John Joseph Marcin, Marlborough, CT (US); Dustin W. Davis, Marlborough, CT (US); David Ulrich Furrer, Marlborough, CT (US); James Tilsley Auxier, Bloomfield, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 16/989,436

(22) Filed: Aug. 10, 2020

(65) Prior Publication Data

US 2020/0370201 A1 Nov. 26, 2020

Related U.S. Application Data

(62) Division of application No. 15/797,799, filed on Oct. 30, 2017, now Pat. No. 10,760,179.

(51) Int. Cl.
*B22D 27/02* (2006.01)
*B22D 27/04* (2006.01)
(Continued)

(52) U.S. Cl.
CPC ............ *C30B 11/003* (2013.01); *B22D 27/02* (2013.01); *B22D 27/045* (2013.01);
(Continued)

(58) Field of Classification Search
CPC ........ B22D 27/02; B22D 27/045; F27B 14/14
See application file for complete search history.

(56) References Cited

U.S. PATENT DOCUMENTS

| 3,538,981 A | 11/1970 | Phipps, Jr. |
| 3,700,023 A | 10/1972 | Giamei et al. |

(Continued)

FOREIGN PATENT DOCUMENTS

| EP | 2233228 A1 | 9/2010 |
| EP | 2363673 A1 | 9/2011 |

(Continued)

OTHER PUBLICATIONS

European Search Report dated Apr. 16, 2019 issued for corresponding European Patent Application No. 18203535.2.
(Continued)

*Primary Examiner* — Kevin E Yoon
(74) *Attorney, Agent, or Firm* — Bachman & LaPointe, P.C.

(57) ABSTRACT

A process for directional solidification of a cast part comprises energizing a primary inductive coil coupled to a chamber having a mold containing a material; energizing a primary inductive coil within the chamber to heat the mold via radiation from a susceptor, wherein the resultant electromagnetic field partially leaks through the susceptor coupled to the chamber between the primary inductive coil and the mold; determining a magnetic flux profile of the electromagnetic field; sensing a magnetic flux leakage past the susceptor within the chamber; generating a control field from a secondary compensation coil coupled to the chamber,
(Continued)

wherein the control field controls the magnetic flux experienced by the cast part; and casting the material within the mold under the controlled degree of flux leakage.

8 Claims, 2 Drawing Sheets

(51) Int. Cl.
    *C30B 11/00*     (2006.01)
    *H05B 6/08*     (2006.01)
    *H05B 6/44*     (2006.01)
    *F27B 14/06*     (2006.01)
    *H05B 6/36*     (2006.01)
    *F27B 14/14*     (2006.01)
    *F27D 21/00*     (2006.01)

(52) U.S. Cl.
    CPC ............ *C30B 11/002* (2013.01); *F27B 14/06* (2013.01); *F27B 14/14* (2013.01); *F27D 21/00* (2013.01); *H05B 6/08* (2013.01); *H05B 6/36* (2013.01); *H05B 6/44* (2013.01)

(56) References Cited

U.S. PATENT DOCUMENTS

| | | | |
|---|---|---|---|
| 3,841,384 A | 10/1974 | Tingquist et al. | |
| 4,202,400 A | 5/1980 | Gigliotti, Jr. et al. | |
| 4,409,451 A | 10/1983 | Taylor | |
| 4,578,794 A * | 3/1986 | Cadek | H05B 3/60 373/42 |
| 4,774,992 A | 10/1988 | George | |
| 5,319,670 A * | 6/1994 | Fox | H05B 6/32 219/648 |
| 5,375,647 A | 12/1994 | Fang et al. | |
| 5,592,984 A | 1/1997 | Schmeideknecht et al. | |
| 5,848,635 A | 12/1998 | Aoi et al. | |
| 5,901,170 A | 5/1999 | Peysakhovich et al. | |
| 6,059,015 A | 5/2000 | Bewlay et al. | |
| 6,510,889 B2 | 1/2003 | Thompson et al. | |
| 7,167,501 B2 * | 1/2007 | Roberts | F27B 14/063 373/147 |
| 7,735,544 B2 | 6/2010 | Kolesnichenko et al. | |
| 8,242,420 B2 | 8/2012 | Fishman | |
| 9,025,636 B2 * | 5/2015 | Chen | H05B 6/367 373/150 |
| 9,476,645 B2 | 10/2016 | Keough | |
| 10,022,787 B2 | 7/2018 | Haun et al. | |
| 10,207,321 B2 | 2/2019 | Jarvis et al. | |
| 2001/0050942 A1 | 12/2001 | Soderstrom et al. | |
| 2003/0234092 A1 | 1/2003 | Brinegar | |
| 2010/0126410 A1 | 5/2010 | Fu et al. | |
| 2010/0238967 A1 * | 9/2010 | Bullied | B22D 27/045 373/152 |
| 2012/0297580 A1 | 11/2012 | Dughiero et al. | |
| 2013/0276939 A1 | 10/2013 | Ebisu | |
| 2016/0288266 A1 | 10/2016 | Rockstroh et al. | |
| 2019/0126344 A1 | 5/2019 | Rebbecchi et al. | |

FOREIGN PATENT DOCUMENTS

| | | |
|---|---|---|
| EP | 3038771 A1 | 7/2016 |
| EP | 3135401 A1 | 3/2017 |
| KR | 20140041250 A | 4/2014 |
| WO | 2011048473 A1 | 4/2011 |

OTHER PUBLICATIONS

European Search Report dated Apr. 16, 2019 issued for corresponding European Patent Application No. 18203516.2.
European Search Report dated May 3, 2019 issued for corresponding European Patent Application No. 18203526.1.

* cited by examiner

METHOD FOR MAGNETIC FLUX COMPENSATION IN A DIRECTIONAL SOLIDIFICATION FURNACE UTILIZING A STATIONARY SECONDARY COIL

CROSS-REFERENCE TO RELATED APPLICATION

This application is a Divisional of U.S. patent application Ser. No. 15/797,799, filed Oct. 30, 2017.

BACKGROUND

The present disclosure is directed to a method and device for directional solidification of a cast part. More particularly, this disclosure relates to a directional solidification casting process that controls a magnetic field to provide a desired microstructure.

A directional solidification (DS) casting process is utilized to orient crystal structure within a cast part. The desired orientation is provided by moving a mold from a hot zone within a furnace into a cooler zone at a desired rate. As the mold moves into the cooler zone, the molten material solidifies along a solidification front traveling in one direction.

Mixing of the molten material at the solidification front within the cast component is known to be deleterious to the quality of single crystal castings. Such mixing can be induced in the molten metal material by a magnetic field generated from an energized coil encircling the furnace cavity. Typically, an induction withdrawal furnace utilizes such an electric coil that produces energy required for maintaining the metal in a molten state. A susceptor is utilized to transduce an electromagnetic field produced by the electric coil into radiant heat transferred to the casting mold.

The susceptor is usually a graphite cylinder located internal to the induction coil and external to the mold. The susceptor is heated by induction coils and radiates heat toward the mold to maintain metal in a molten state, and is intended to isolate the magnetic field from the hot zone of the furnace.

Casting single crystal gas turbine parts can experience less than 100% yields. Some defects that occur during the casting process are separately nucleated grains, freckels, porosity, mis-oriented boundaries, and others. The causes of these defects are not always known, but have been empirically determined to be influenced by the geometry of the part and the relative orientation of the part and the mold in the furnace. It is hypothesized that remnant magnetic field in the interior of the susceptor may be detrimental to the production of the desired microstructure in a cast part. Calculations have been made estimating the significance for a given production furnace design.

It has been recognized that the leakage of the magnetic field into the furnace hot zone could directly influence the solidification process during casting.

SUMMARY

In accordance with the present disclosure, there is provided a process for directional solidification of a cast part comprising energizing a primary inductive coil coupled to a chamber having a mold containing a material; energizing a primary inductive coil within the chamber to heat the mold, wherein the resultant electromagnetic field partially leaks through a susceptor coupled to the chamber between the primary inductive coil and the mold; determining a magnetic flux profile of the leaked magnetic field; sensing a magnetic flux leakage past the susceptor within the chamber; generating a control field from a secondary compensation coil proximate the chamber, wherein said control field adjusts said magnetic flux that has leaked past the susceptor; and casting the material within the mold under the controlled degree of flux leakage.

In another and alternative embodiment, the magnetic flux leakage comprises a portion of the electromagnetic field passing through the mold that is not blocked by the susceptor.

In another and alternative embodiment, the control field is increased or decreased to control inductive stirring in the casting material to produce a predetermined microstructure.

In another and alternative embodiment, the control field controls the primary induction coil magnetic flux leakage into the mold.

In another and alternative embodiment, the process further comprises generating a control signal, the control signal being responsive to at least one of a flux sensor input and a flux set point input.

In another and alternative embodiment, the control signal is sent to a power amplifier that generates the electrical power sent to the secondary compensation coil for generating the control field.

In another and alternative embodiment, the secondary compensation coil is fixed relative to the susceptor.

In accordance with the present disclosure, there is provided an induction furnace assembly comprising a chamber containing a mold; a primary inductive coil coupled to the chamber; a susceptor surrounding the chamber between the primary inductive coil and the mold; and at least one secondary compensation coil fixed to the chamber between the susceptor and the mold; the at least one secondary compensation coil configured to generate a control field configured to control a magnetic flux leakage past the susceptor from the primary induction coil.

In another and alternative embodiment, a controller is coupled to at least one flux sensor located within the chamber, wherein the controller is configured to generate a control signal responsive to an input from at least one of a flux sensor and a flux set point.

In another and alternative embodiment, a power amplifier is coupled to the controller and the secondary compensation coil, wherein the power amplifier generates electrical power responsive to the control signal to the at least one secondary compensation coil to generate the control field.

In another and alternative embodiment, the magnetic flux leakage is sensed by at least one flux sensor at a predetermined location within the chamber.

In another and alternative embodiment, the controller comprises a set point comparator.

In another and alternative embodiment, the at least one secondary compensation coil is coupled to a control system configured to control material casting.

In accordance with the present disclosure, there is provided a process for directional solidification of a cast part comprising generating an electromagnetic field from a primary inductive coil coupled to a chamber of an induction furnace, wherein the electromagnetic field includes a magnetic field leakage that passes a susceptor coupled to the chamber between the primary inductive coil and a mold; controlling the magnetic field leakage entering the mold inside the chamber by use of an applied magnetic control field generated by at least one secondary compensation coil fixed between the susceptor and the mold in the chamber; and casting a part within the mold from a molten material In another and alternative embodiment, the casting step further comprises at least one of increasing and decreasing the applied magnetic field to control a stirring in the casting material to produce a predetermined microstructure.

In another and alternative embodiment, the process further comprises generating a control signal, the control signal being responsive to at least one of a flux sensor input and a flux set point input.

In another and alternative embodiment, the process further comprises transmission of electrical power to the at least one secondary compensation coil to generate the control field, responsive to the control signal.

In another and alternative embodiment, the process further comprises sensing the magnetic field leakage past the susceptor within the chamber with at least one flux sensor.

Other details of the method and device for directional solidification of a cast part are set forth in the following detailed description and the accompanying drawings wherein like reference numerals depict like elements.

DETAILED DESCRIPTION

Figure 1:
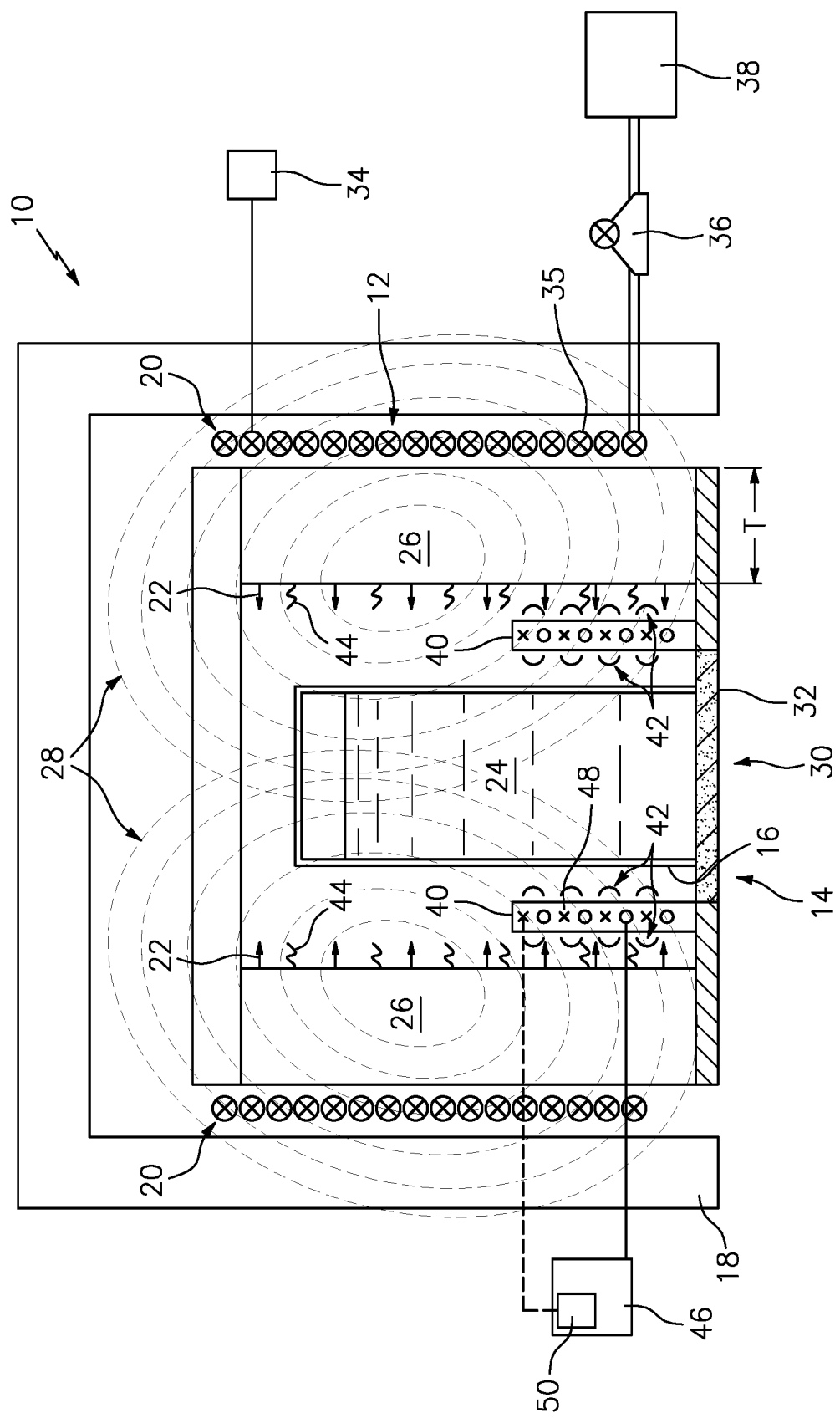
FIG. 1 is a schematic illustration of an exemplary inductive furnace with a mold disposed within the furnace.

Referring to FIG. 1, an exemplary induction furnace assembly 10 includes a chamber 12 that includes an opening 14 through which a mold 16 is received and withdrawn. The chamber 12 is isolated from the external environment by insulated walls 18. A primary inductive coil 20 generates an electromagnetic field which is converted into heat by the susceptor. Heat, indicated by arrows 22, serves to heat a material 24 within the mold 16 to a desired temperature.

The exemplary furnace assembly 10 includes a susceptor 26 that partially absorbs the electromagnetic field (schematically shown at 28) that is generated by the primary inductive coil 20. The susceptor 26 is a wall that surrounds the chamber 12. The susceptor 26 is fabricated from material such as graphite that absorbs the electromagnetic field 28 produced by the primary inductive coil 20. The susceptor 26 can also provide for the translation of energy from the electromagnetic field into heat energy, as indicated at arrows 22 to further maintain a temperature within the mold 16. In the disclosed example, molten metal material 24 is disposed in the mold 16 which in turn is supported on a support 30. The support 30 includes a chill plate 32 that both supports the mold 16 and includes cooling features to aid in cooling and directional solidification of the molten material 24.

The primary inductive coil 20 receives electrical energy from an electric power source schematically indicated at 34. This electrical energy is provided at a desired current level determined to provide sufficient power and energy to create the desired temperature within the chamber 12 that maintains the metal 24 in a molten state.

The primary inductive coil 20 comprises a plurality of electrically conductive hollow tubes 35. The plurality of tubes 35 also provide for the circulation of a fluid that is generated by a pump 36 that supplies fluid from a fluid source 38 to flow through the tubes 35.

In operation, the furnace 10 is brought up to a desired temperature by providing a sufficient current from the electric power source 34 to the primary inductive coil 20. Water supplied from the pump 36 and fluid source 38 is pumped through the plurality of tubes 35 that make up the inductive coil 20. The heat 22 created by the partial conversion of the electromagnetic field by the susceptor 26 heats the core furnace zone in the chamber 12 to a desired temperature. Once a desired temperature is reached, molten material, metal 24 is poured into the mold 16. The mold 16 defines the external shape and features of the completed cast article.

In the exemplary directional solidification casting process utilized, after the molten material 24 is poured into the mold 16 within the chamber 12 the material 24 is maintained at a desired temperature in a molten state. The support 30 and chill plate 32 are then lowered from the opening 14 out of the hot chamber 12 through a baffle. The mold 16 is lowered from the chamber 12 at a desired rate to cool the molten material 24 in a controlled manner to produce desired columnar structure or single crystal. The controlled cooling produces a solidification front within the molten material 24.

In many applications, the completed cast part is desired to include a specific grain structure. The size, orientation, and structure of grains within the completed cast part provide desired material characteristics and performance, such as for example material fatigue performance. The exemplary furnace assembly 10 includes the susceptor 26 with a constant thickness to block an amount of the electromagnetic field 28. The portion of electromagnetic field 28 that passes the susceptor 26, that is, magnetic flux leakage 44, has potential to generate a certain amount of magnetic stirring within the molten metal material 24.

The generated electromagnetic field 28 not absorbed by the susceptor has a potential to produce currents within the molten metal material 24 that interact with the molten metal material 24 to provide stirring and mixing and may inhibit defect-free single crystal growth. In a standard induction furnace, the susceptor 26 is sized to include a thickness that is thick enough to shield the electromagnetic field within the hot zone of the chamber 12. However, it has been discovered that a certain amount of electromagnetic field 28 may leak past the susceptor 26. This electromagnetic field 28 leakage may be unwanted and detrimental to proper grain structure formation.

The exemplary furnace 10 includes a secondary compensation coil 40 fixed to the chamber 12. The secondary compensation coil 40 is configured to generate a control field 42. The control field 42 can be a secondary field to control the local electromagnetic field at the solidification front. The control field 42 can cancel magnetic flux leakage 44 from the primary induction coil 20 or constructively increase the flux experienced by the mold 16. The control field 42 can be generated depending on the magnetic flux leakage 44 at predetermined locations, such as proximate the mold 16, within the chamber 12, within the mold 16, and the like. The magnetic flux leakage 44 can include the portions of the electromagnetic field 28 passing through the mold 16 that are not blocked by the susceptor 26.

The secondary compensation coil 40 is a fixed coil relative to the susceptor 26. The secondary compensation coil 40 can be coupled to a power amplifier 46. The power amplifier 46 can be coupled to flux sensors 48. The flux sensors 48 can transmit data to a controller 50 as part of a control system 52 shown in more detail at FIG. 2. In this way stirring can be better controlled or eliminated within the molten material to produce castings with desired microstructure.

Figure 2:
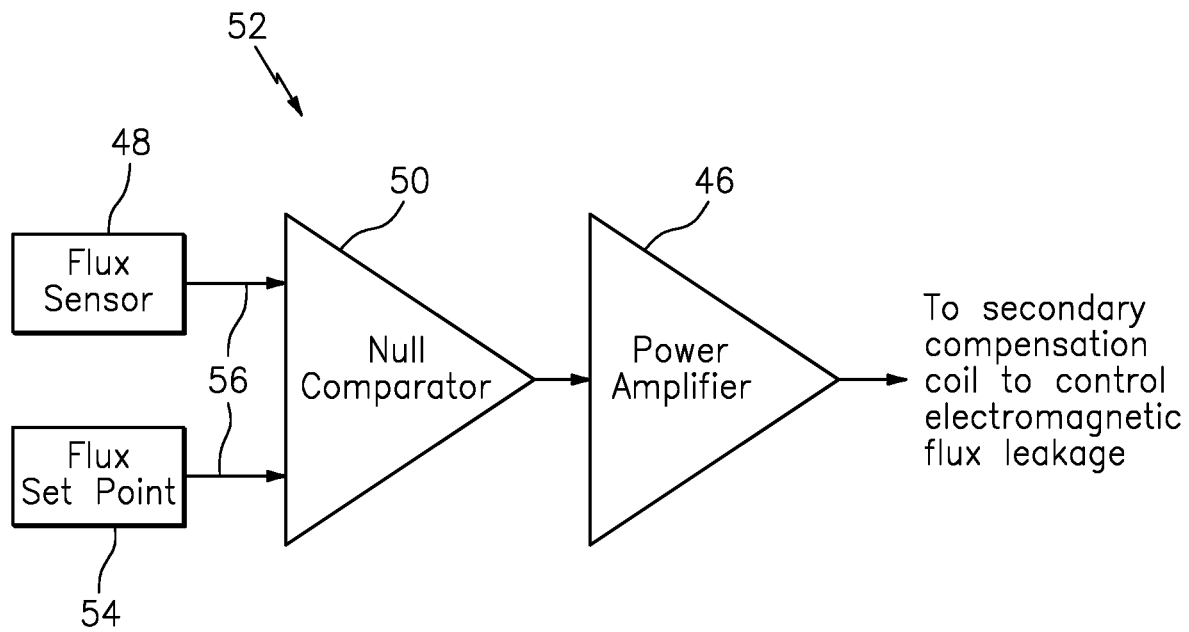
FIG. 2 is a controls schematic for an exemplary method and system for directional solidification of a cast part.

As shown in FIG. 2, the control system 52 can include a plurality of magnetic flux sensors 48 positioned in predetermined locations for detection of the magnetic flux leakage 44. A flux set point 54 can be set based on empirical data, physics-based modeling, materials being cast, a property of the primary inductive coil 20, a property of the susceptor 26, the chamber 12 and the like. The flux set point 54 can be part of a proportional, differential, integral controller 50 that is designed to null out residual electromagnetic field, or tailor a response such that magnetic stirring is controlled to desired set point. The actual control schedule may be derived through a combination of empirical setting data or by thermal fluid analysis of the melt. Alternatively, the control schedule response to the flux sensor 48 may be tailored to produce no stirring or complete stirring, where again the actual controller signal 58 may be derived empirically or supported by thermal fluid analysis. The flux sensor (s) 48 and flux set point 54 provide inputs 56 to the controller 50. In an exemplary embodiment, the controller 50 can comprise a null point comparator. The controller 50 receives the inputs 56 from the flux sensor(s) 48 and flux set point 54 and generates a control signal 58 to the power amplifier 46. In an exemplary embodiment, the control signal 58 can comprise an error signal generated by the null point comparator. The power amplifier 46 then generates the electrical power to produce the frequency and amplitude to the secondary compensation coil 40 during the solidification process for control of the solidification of the metal 24. The secondary compensation coil 40 generates the control field 42.

In an exemplary embodiment, the control field 42 can be utilized to "control to nullify." The electromagnetic control field 42 from the secondary compensation coil 40 can be created so that the control field 42 is partially or wholly out of phase with the electromagnetic field 28. The control system 52 can generate an appropriate control signal 58 to the secondary compensation coil 40 to nullify the magnetic flux leakage 44 experienced by the mold 16 to a range of about 0-200 Gauss range, 10 Gauss resolution, and 2 Gauss accuracy.

In an exemplary embodiment, the control field 42 can be utilized to "control to amplify." The electromagnetic control field 42 from the secondary compensation coil 40 can be created so that it is partially or wholly in phase with primary electromagnetic field 28. The control system 52 can generate an appropriate control signal 58 to the secondary compensation coil 40 to amplify the magnetic flux leakage 44 experienced by the mold 16 to a range of about 100-50,000 Gauss.

Figure 3:
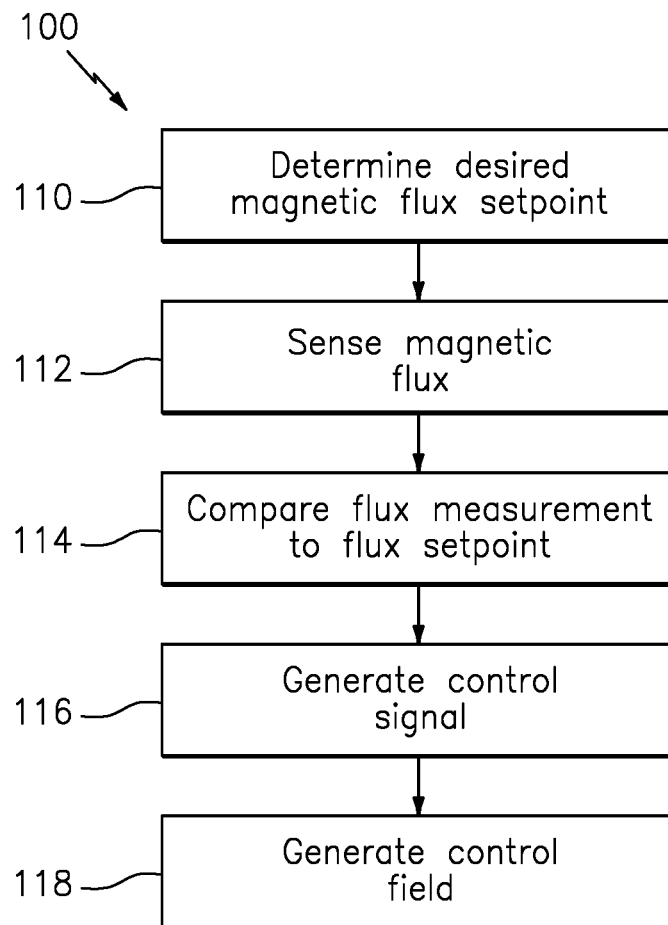
FIG. 3 is a process map of an exemplary method and system for directional solidification of a cast part.

An exemplary process map is illustrated at FIG. 3. The process for controlled solidification behavior 100 can include, at step 110, determining a desired magnetic flux profile at a selected location in the chamber 12. At step 112, the magnetic flux is sensed at a predetermined location where flux control is desired. At step 114 the flux measurement can be compared to a flux set point. At step 116 a control signal can be generated by the controller 50. At step 118, a control field 42 can be generated by the secondary compensation coil 40. The amount, frequency and amplitude of electrical power can be used to drive the secondary compensation coil 40 to generate the control field 42 during solidification of the metal 24 to control the electromagnetic field 28 that influences the solidification of the metal 24. In another exemplary embodiment, physics-based models can be utilized to actively control the power amplifier 46 and thus, generate the control field 42 to control the magnetic flux leakage 44.

It is desirable to control the magnetic stirring within the molten material 24 as the mold 16 leaves the hot chamber 12 and begins to solidify to produce the desired micro-structure within the completed cast part. The electromagnetic control field 42 can be increased or decreased to control the stirring in order to produce desired microstructure.

Accordingly, the disclosed exemplary inductive furnace assembly provides for the control of magnetic flux leakage and resultant stirring based on a fixed secondary compensation coil proximate the mold that in turn produce the desired microstructures with the cast part.

There has been provided a method and device for directional solidification of a cast part. While the method and device for directional solidification of a cast part has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. An induction furnace assembly comprising:
   a chamber containing a mold;
   a primary inductive coil coupled to said chamber;
   a susceptor surrounding said chamber between said primary inductive coil and said mold;
   at least one secondary compensation coil fixed to said chamber between said susceptor and said mold; said at least one secondary compensation coil configured to generate a control field configured to control a magnetic flux leakage past said susceptor from said primary induction coil; and
   a controller coupled to at least one flux sensor located within said chamber, wherein said controller is configured to generate a control signal responsive to an input from at least one of a flux sensor and a flux set point; wherein said magnetic flux leakage is detectable by said at least one flux sensor at a predetermined location within said chamber.

2. The induction furnace assembly according to claim 1, further comprising:
   a power amplifier coupled to said controller and said secondary compensation coil, wherein said power amplifier generates electrical power responsive to said control signal to said at least one secondary compensation coil to generate said control field.

3. The induction furnace assembly according to claim 1, wherein said controller comprises a set point comparator.

4. The induction furnace assembly according to claim 1, wherein said at least one secondary compensation coil is coupled to a control system configured to control material casting.

5. A process for directional solidification of a cast part comprising:
   generating an electromagnetic field from a primary inductive coil coupled to a chamber of an induction furnace, wherein said electromagnetic field includes a magnetic field leakage that passes a susceptor coupled to said chamber between said primary inductive coil and a mold;
   controlling said magnetic field leakage entering said mold inside said chamber by use of an applied magnetic control field generated by at least one secondary compensation coil fixed between said susceptor and said mold in said chamber by employing a controller coupled to at least one flux sensor located within said chamber, wherein said controller is configured to generate a control signal responsive to an input from at least one of a flux sensor and a flux set point; wherein said magnetic field leakage is detectable by said at least one flux sensor at a predetermined location within said chamber;

sensing said magnetic field leakage past the susceptor within the chamber with said at least one flux sensor; and casting a part within said mold from a molten material.

6. The process of claim 5, wherein said casting step further comprises:

at least one of increasing and decreasing said applied magnetic control field to control a stirring in the casting material to produce a predetermined microstructure.

7. The process of claim 5, further comprising:

generating a control signal, said control signal being responsive to at least one of the flux sensor input and the flux set point input.

8. The process of claim 7, further comprising:

transmitting electrical power to said at least one secondary compensation coil to generate said control field, responsive to said control signal.

\* \* \* \* \*